(12) United States Patent
Hasegawa et al.

(10) Patent No.: US 6,833,719 B2
(45) Date of Patent: Dec. 21, 2004

(54) APPARATUS FOR EVALUATING ELECTRICAL CHARACTERISTICS

(75) Inventors: Tsuyoshi Hasegawa, Wako (JP);
Masakazu Aono, Wako (JP);
Tomonobu Nakayama, Wako (JP);
Taichi Okuda, Tsukuba (JP); Kazuya Terabe, Toda (JP); Hirofumi Tanaka, Niiza (JP)

(73) Assignees: Japan Science and Technology Corporation, Kawaguchi (JP); Riken, Wako (JP)

( * ) Notice: Subject to any disclaimer, the term of this patent is extended or adjusted under 35 U.S.C. 154(b) by 0 days.

(21) Appl. No.: 10/148,900

(22) PCT Filed: Dec. 12, 2000

(86) PCT No.: PCT/JP00/08776

§ 371 (c)(1),
(2), (4) Date: Jun. 19, 2002

(87) PCT Pub. No.: WO01/46674

PCT Pub. Date: Jun. 28, 2001

(65) Prior Publication Data

US 2002/0178800 A1 Dec. 5, 2002

(30) Foreign Application Priority Data

Dec. 20, 1999 (JP) .......................................... 11/360274

(51) Int. Cl.$^7$ ............................................. G01R 31/02
(52) U.S. Cl. .................................................. 324/762
(58) Field of Search ................................ 73/105, 866.5;
324/757, 758, 761, 762, 765–769

(56) References Cited

U.S. PATENT DOCUMENTS

| | | | | | |
|---|---|---|---|---|---|
| 4,480,223 A | * | 10/1984 | Aigo | ........................... | 324/752 |
| 6,148,662 A | * | 11/2000 | Lin | ............................. | 73/105 |
| 6,211,685 B1 | * | 4/2001 | Stanford et al. | ............. | 324/716 |
| 6,529,024 B2 | * | 3/2003 | Noda | ......................... | 324/754 |

FOREIGN PATENT DOCUMENTS

| | | |
|---|---|---|
| JP | 6-123621 | 5/1994 |
| JP | 9-94677 | 4/1997 |
| JP | 9-326425 | 12/1997 |
| JP | 10-38916 | 2/1998 |
| JP | 2000-284025 | 10/2000 |

OTHER PUBLICATIONS

Masakazu Aono et al.: "Nano scale no butsusei ya kinou wo dou haharuka; nano kouzou no "kouchiku" kara "keisoku" e" Ouyou Butsuri, vol. 67, No. 12, pp. 1361–1369 Dec. 10, 1998.

* cited by examiner

*Primary Examiner*—Robert Raevis
(74) *Attorney, Agent, or Firm*—Oblon, Spivak, McClelland, Maier & Neustadt, P.C.

(57) ABSTRACT

An apparatus provided for evaluating electrical characteristics by bringing a plurality of metal probes in contact with a sample. A metal probe is formed on a free end of a cantilever on which are formed a resistor, two electrodes for resistance detection, and an electrode for measuring electrical characteristics. A tip of the metal probe projects beyond the free end of the cantilever. The probe position is controlled by an atomic force microscopy.

7 Claims, 15 Drawing Sheets

F I G. 1
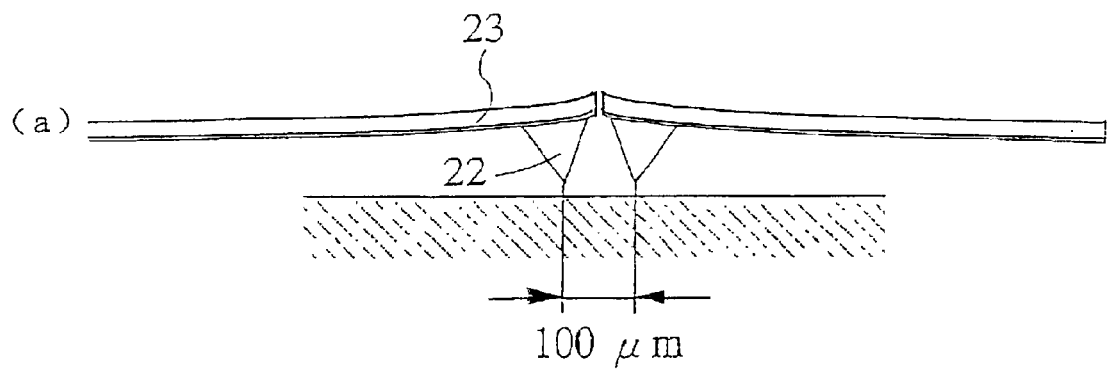
(a)
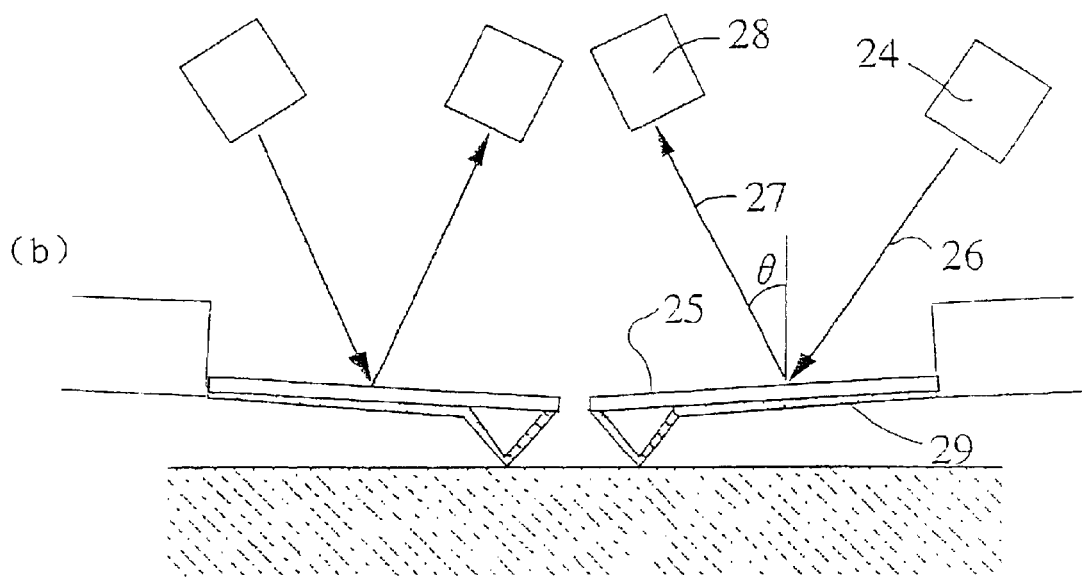
(b)

F I G. 4
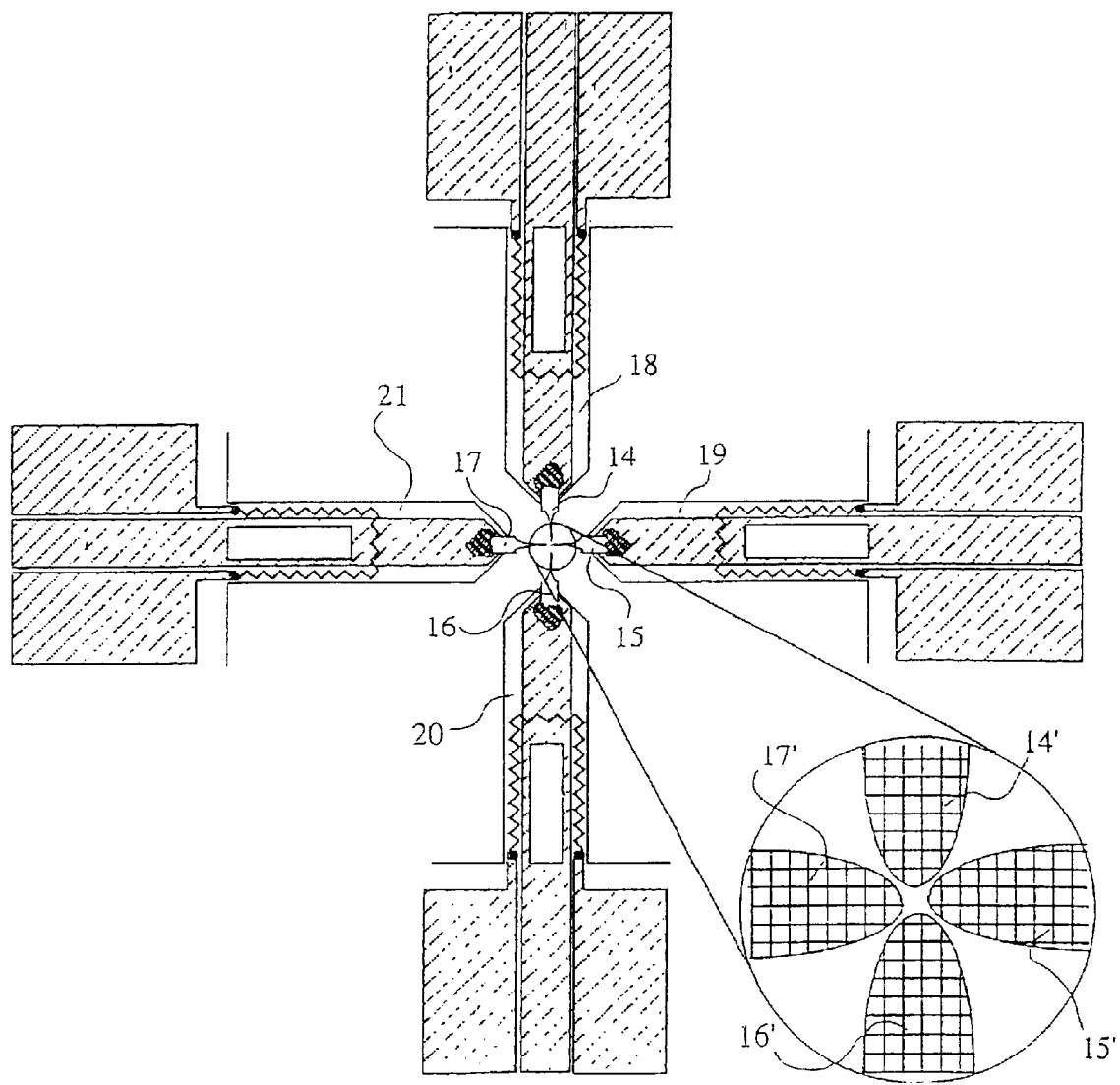

F I G. 9
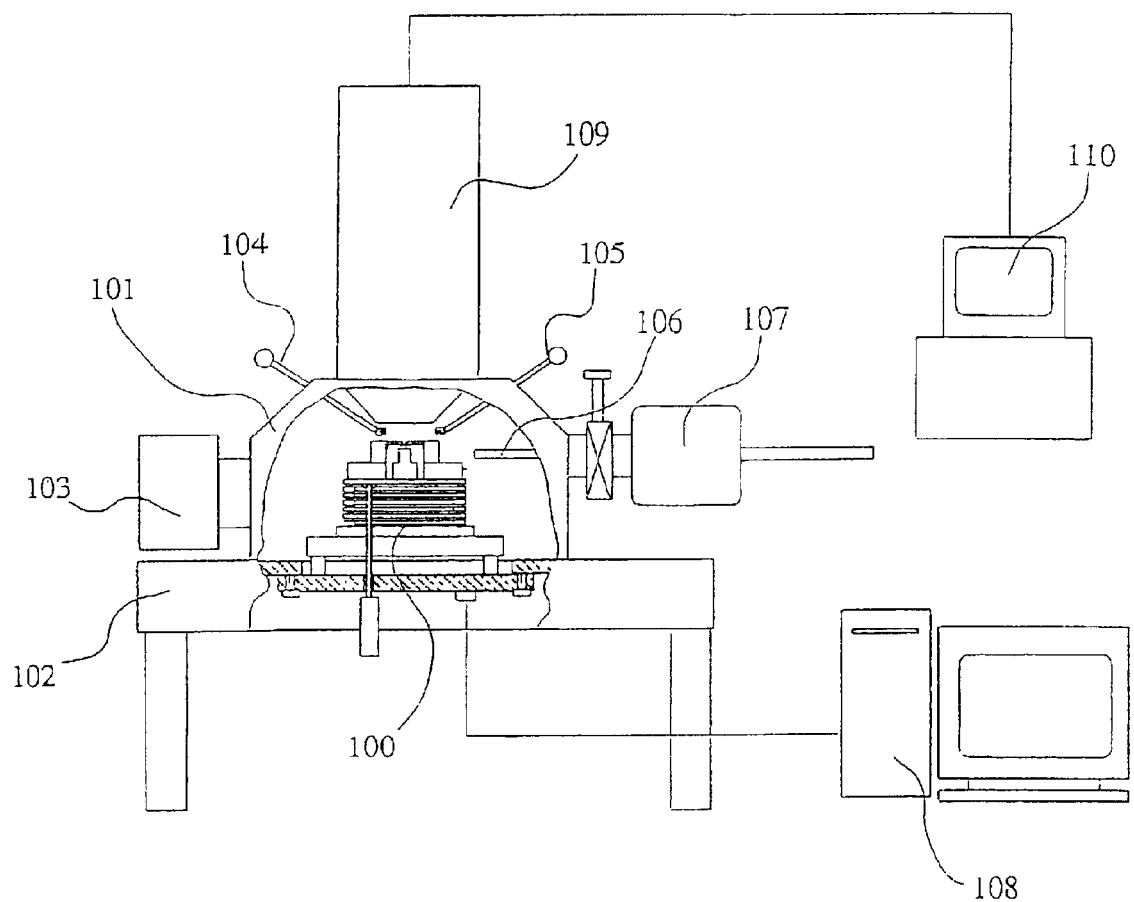

F I G. 11
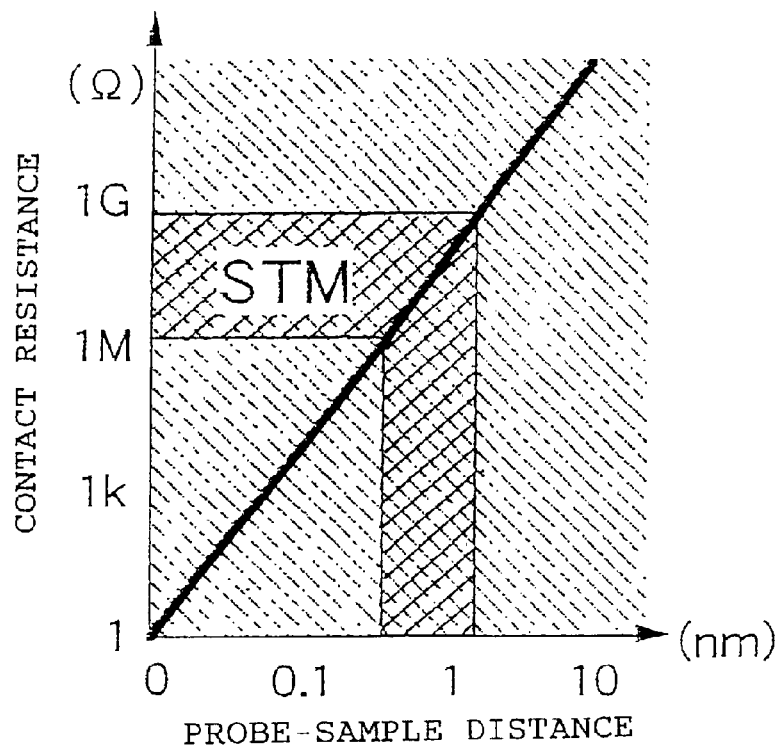
F I G. 12
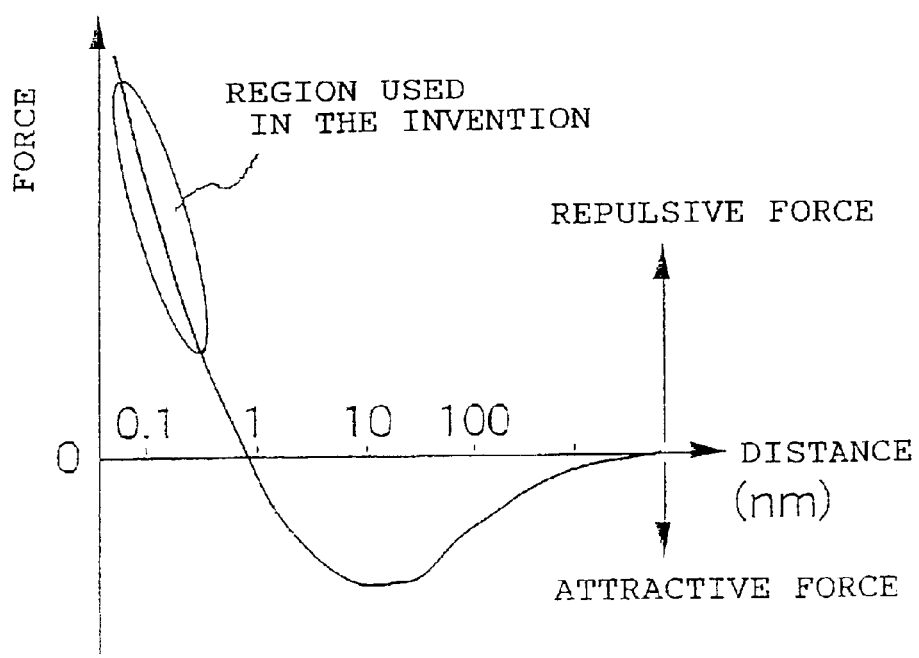

FIG. 13
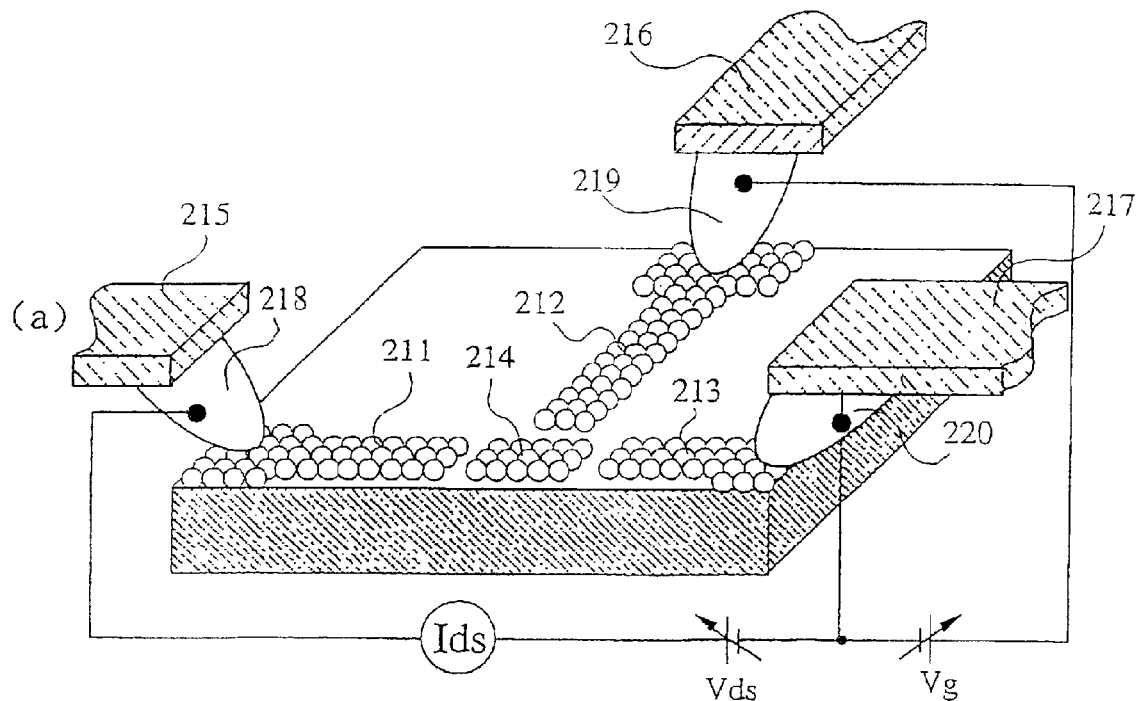
(a)
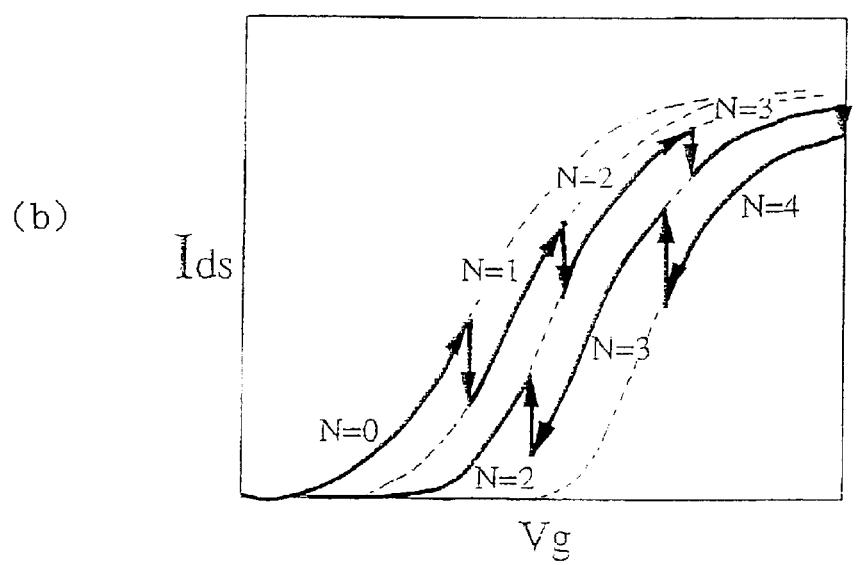
(b)

APPARATUS FOR EVALUATING ELECTRICAL CHARACTERISTICS

TECHNICAL FIELD

The present invention relates to an electrical-characteristic evaluation apparatus for measuring electronic properties within a minute area.

BACKGROUND ART

In a known conventional method for measuring electronic properties within a minute area, the minute area is electrically connected to a macro electrode or a measurement probe by use of electric wiring.

An example of such a method is disclosed in, for example, Surface Science, 386 (1997), pp. 161–165. In the disclosed method, through vapor deposition employing a mask, a metal wiring line having a width on the order of microns is formed in such a manner that the wiring line extends toward a minute area within which electrical characteristics are to be measured.

Further, Nature, 393 (1998), pp. 49–52 reports a method in which characteristics of a carbon nanotube are measured by use of wiring connection. In this method, a carbon nanotube is evaporated onto a substrate having a previously formed wiring line to thereby be connected to the wiring line, and the electrical characteristics of the carbon nanotube are measured.

Meanwhile, there has been reported a method in which a metal probe having a sharpened tip is brought into direct contact with a minute area in order to measure electrical characteristics within the minute area. For example, a method using scanning tunneling microscopy is described in *Oyo Buturi*, vol. 67, No. 12 (1998), pp. 1361–1369.

Moreover, Japanese Patent Application Laid-Open (kokai) No. 10-56045 describes a method for measuring characteristics of an electronic element formed in a sub-micron area. In these methods, a probe is caused to approach a sample to a degree such that tunneling current flows between the probe and the sample, to thereby establish electrical connection between the probe and the sample in a minute area. Further, in order to reduce the contact resistance between the probe and the sample, after detection of tunneling current, feedback control of the probe position performed while using the tunneling current as a servo signal is stopped, and the distance between the probe and the sample is forcedly reduced before performance of measurement of electrical characteristics.

DISCLOSURE OF THE INVENTION

However, the above-described conventional methods involving formation of wiring lines cannot cope with a structure of nanometer size, because the width and pitch of wiring lines cannot be made less than 0.1 μm, even when the latest semiconductor processing technique is used.

Further, since the electrical connection between a wiring line and a structure to be measured is established by means of simple adhesion, the contact resistance between the wiring line and the sample increases. For example, in the above-described measurement for a carbon nanotube, the contact resistance is estimated to be about 1 MΩ. The resistance of a structure portion in which a quantized conductance appears is as high as several kΩ. Therefore, when resistance of such a structure portion is measured by the conventional method, there arises a problem in that the contact resistance is higher than a resistance to be measured.

Further, in the case in which a wiring line has been formed in advance, samples having different structures and sizes cannot be handled. In the case in which a wiring line is formed after placement of a sample, a wiring line that matches the sample can be formed; however, this method involves an extremely high possibility of the sample being damaged during formation of the wiring line, thereby preventing accurate measurement.

In the above-described method involving use of a sharpened probe, electrical characteristics are measured in a state in which the probe has been caused to approach a sample to a degree such that tunneling current flows between the probe and the sample. In such a case, the contact resistance is about 1 MΩ to 1 GΩ. Therefore, even in measurement of a semiconductor sample, the very high contact resistance lowers the reliability and accuracy of the measurement. In view of this, in the conventional method, the probe is caused to further approach the sample by a predetermined distance, to thereby reduce the contact resistance.

However, in this case, since feedback control of the probe position is not performed, the positional relation; in particular the distance, between the probe and the sample may change during the course of measurement, due to temperature drift of the sample and other factors. In a region in which tunneling current flows between the probe and the sample (tunneling region), when the distance between the probe and the sample changes by 1 Å, the contact resistance changes by one order of magnitude. Therefore, when feedback control of the probe position is not performed during the course of measurement of electrical characteristics, the positional relation between the probe and the sample is not guaranteed, with the result that the absolute value of a contact resistance contained in measurement results cannot be determined and is not guaranteed to be constant.

In view of the foregoing, an object of the present invention is to provide an electrical-characteristic evaluation apparatus which can bring a plurality of metal probes into contact with a minute area with low contact resistance.

In the present invention, position of the probe is controlled by means of atomic force microscopy in order to establish contact between the probe and a sample. Therefore, the probe position can be controlled during measurement of electrical characteristics. In order to reduce the contact resistance between the probe and the sample, the probe position is controlled to within a region such that the atomic force between the probe and the sample becomes repulsive.

Further, in the present invention, in order to enable a plurality of probes to approach a minute area, cantilevers are fabricated and used. Each cantilever has a metal probe which is provided at the free end of the cantilever and whose tip projects from the free end. This enables the plurality of metal probes to approach one another to a degree such that their tips do not come into contact with one another. That is, the probes can be caused to approach a minute area to a degree equivalent to that attained in the conventional method employing scanning tunneling microscopy. In the present invention, a technique for cutting/depositing a material by use of a focused ion beam is employed in order to form a metal probe at the free end of each cantilever.

By use of this technique, a metal probe whose tip has a radius of curvature of about several tens of nm and a length of about several tens of μm is transplanted to the free end of the cantilever. In the present invention, in order to enable independent control of positions of the respective probes, variations in resistance of a resistor element which is formed on each of the cantilevers are used as means for detecting displacement of the cantilever.

In another method, a piezoelectric effect of a piezoelectric element formed on each cantilever is detected. In order to enable the detection, each of the cantilevers used in the present invention has, in addition to the resistor element or the piezoelectric element, two electrodes for detection of displacement of the cantilever, and one electrode for measurement of electrical characteristics of a sample.

BRIEF DESCRIPTION OF THE DRAWINGS

FIG. 1 is a set of schematic views showing a case in which conventional-type cantilevers are used.

FIG. 4 is a schematic view showing a case in which a plurality of probes according to the present invention are caused to approach one another.

FIG. 9 is a system schematic diagram of an electrical-characteristic measurement apparatus according to a second embodiment of the present invention in which cantilevers are mounted.

FIG. 11 is a graph relating to a third embodiment of the present invention and schematically showing the relationship between probe-sample distance and probe-sample contact resistance.

FIG. 12 is a graph relating to the third embodiment of the present invention and schematically showing the relationship between probe-sample distance and force acting between the probe and the sample.

FIG. 13 is a view and a graph schematically showing measurement of operation characteristics of a nano-transistor performed by use of the present invention.

BEST MODE FOR CARRYING OUT THE INVENTION

In the present invention, electrical characteristics within a minute area are measured by use of an apparatus equipped with a plurality of cantilevers each having a metal probe disposed at the free end thereof. Use of cantilevers provided with metal probes whose tips projects beyond the respective free ends of the cantilevers enables realization of a minimum inter-probe distance (on the order of 10 nm) equivalent to that achieved in scanning tunneling microscopy.

Further, since control of the probe position is performed by means of atomic force microscopy, the probe position can be controlled during measurement of electrical characteristics in order to eliminate positional shift between the probe and a sample due to a thermal drift occurring during the measurement of electrical characteristics. Moreover, in the present invention, in order to reduce the contact resistance between the probe and the sample, the probe position is controlled so as to remain within a region such that the atomic force acting between the probe and the sample becomes repulsive. This enables the plurality of probes to be brought into contact with a minute area with low contact resistance, thereby enabling accurate measurement of electrical characteristics within the minute area.

Figure 3:
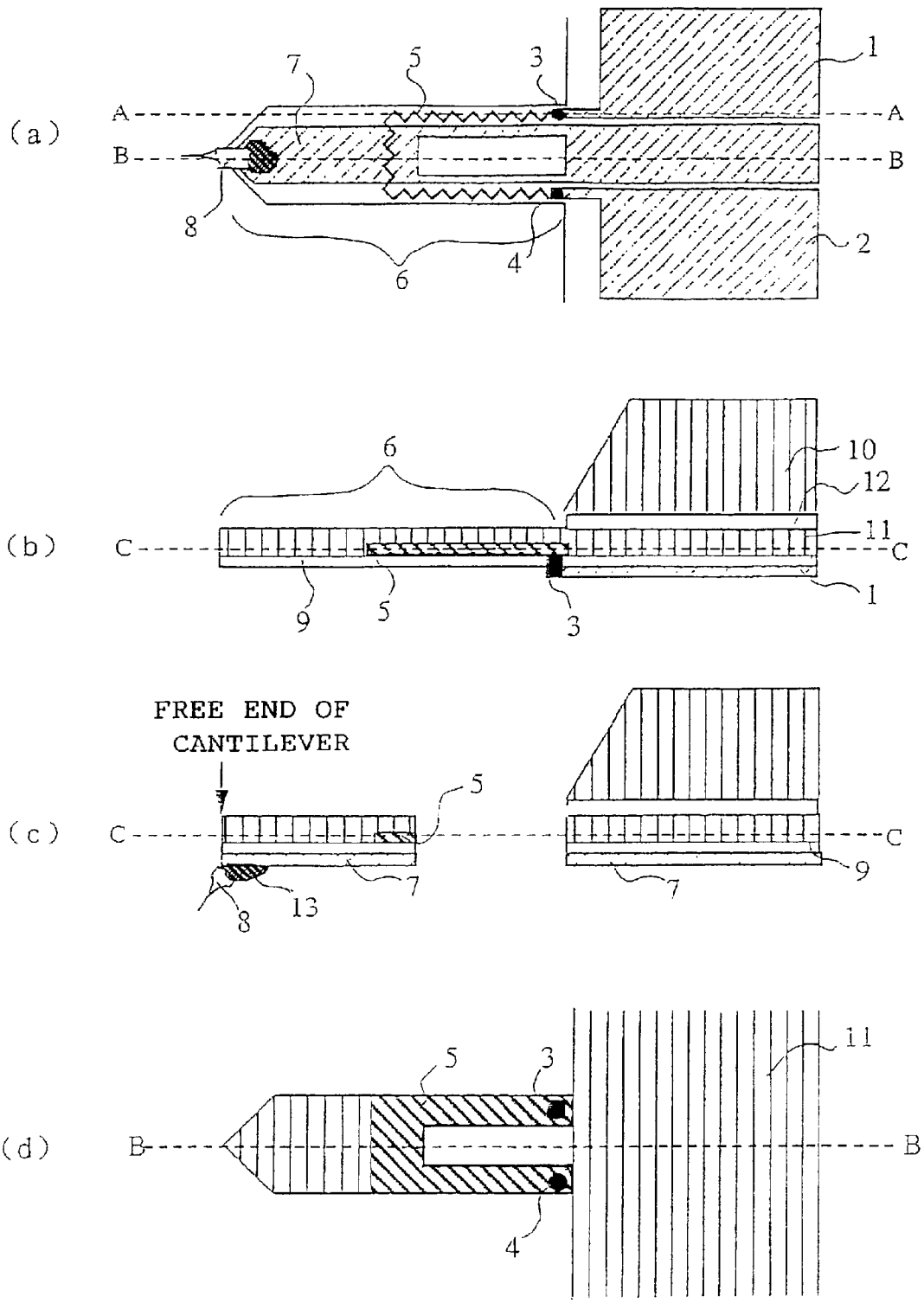
FIG. 3 is a set of schematic views showing a cantilever according to a first embodiment of the present invention.

FIG. 3 is a set of schematic views showing a cantilever according to a first embodiment of the present invention. FIG. 3(a) shows a bottom view (a view as viewed from a sample side) of the cantilever. The details of the steps for fabricating the cantilever will be described later with reference to FIGS. 5 to 8.

Electrodes 1 and 2 for measuring the resistance of a resistor element are formed on the lower surface of the cantilever and are connected to a resistor section 5 [shown as a symbol of a resistor in FIG. 3(a)] via contact hole electrodes 3 and 4. This configuration enables detection of change in the resistance of the resistor section 5 stemming from deflection of the cantilever 6. An electrode 7, which extends to the free end of the cantilever 6, is formed on the cantilever 6; and a metal probe 8 is disposed at the tip of the electrode 7. The tip of the metal probe 8 projects beyond the free end of the cantilever 6. Therefore, even when a plurality of metal probes are caused to approach one another, the free ends of the cantilevers do not interfere with one another before the metal probes come into contact with one another.

In other words, the metal probes can be caused to approach one another to a degree determined by the radius of curvature of the tips of the metal probes, thereby enabling realization of a minimum inter-probe distance equivalent to that achieved in the scanning tunneling microscopy in which a metal probe having a sharpened tip is used. Although not shown in FIG. 3, the electrodes 1, 2, and 7 are connected to a macro measurement system.

FIG. 4 is a schematic view showing a case in which four probes 14, 15, 16, and 17 have been caused to approach mutually. In FIG. 4, the tips 14', 15', 16', and 17' of the metal probes are shown in an enlarged view within a circle. As can be seen, the minimum inter-probe distance is determined not by the cantilevers 18, 19, 20, and 21, but by the radius of curvature of the tips 14', 15', 16', and 17' of the metal probes.

Therefore, in the present invention, use of cantilevers carrying metal probes whose tips have a radius of curvature of 10 nm enables realization of a minimum inter-probe distance on the order of 10 nm.

Figure 16:
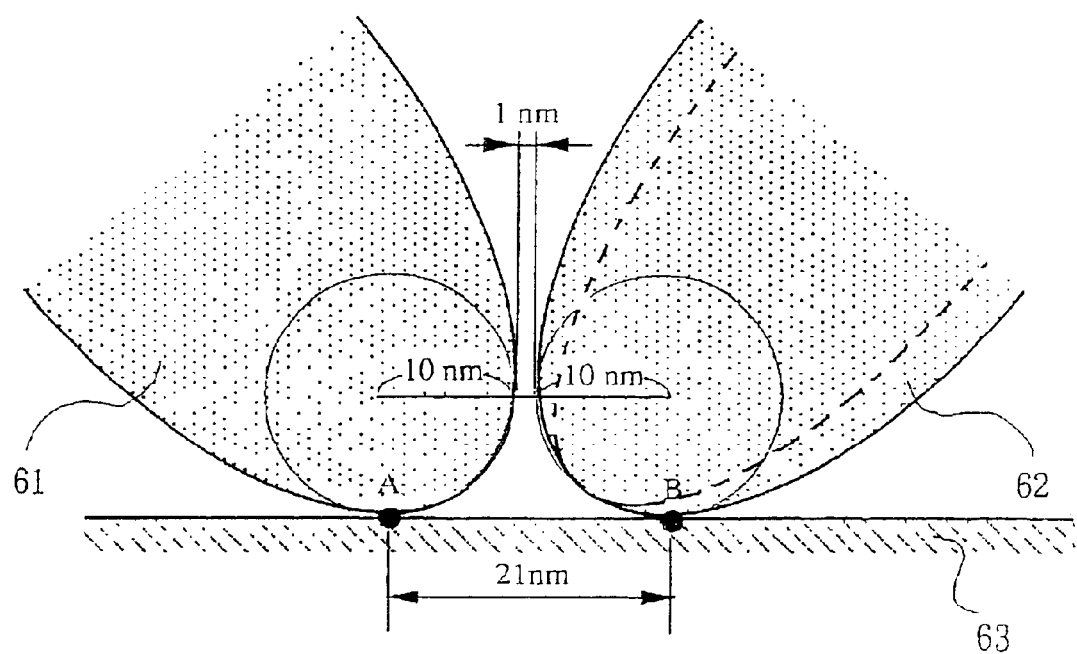
FIG. 16 is a view showing the state of use of cantilevers according to the present invention.

FIG. 16 shows a state in which two probes 61 and 62 whose tips have a radius of curvature of 10 nm are in contact with a sample surface 63 with the minimum inter-probe distance formed therebetween.

For reference, circles having a radius of 10 nm are depicted in such a manner that the circles coincide with the tip portions of the probes 61 and 62. The probes 61 and 62 are in contact with the sample surface 63 via points A and B.

Since the purpose of the present invention is evaluation of electrical characteristics of the sample, the distance between the portions in contact with the sample surface 63 (the distance between A and B in FIG. 16) is called a probe distance. During measurement, the probes 61 and 62 can be caused to approach each other to thereby decrease the probe distance to a degree such that tunneling current flows.

That is, the probes can be caused to approach each other such that distance therebetween becomes about 1 nm. At this time, the distance between A and B; i.e., the minimum probe distance, becomes 21 nm. The above assumes that the tips of the probes each have a completely spherical shape. However, when probes having a shape (radius of curvature: 10 nm) indicated by a broken line in FIG. 16 are used, the minimum probe distance can be reduced further.

By contrast, in the conventional cantilevers as shown in FIG. 1(a), a probe 22 is formed in the vicinity of the free end of each cantilever 23 through selective etching. Therefore, the closest distance between the tips of the pyramidal probes 22 depends on the size of pyramids. In the case of typical cantilevers, the length of the base of each pyramidal probe is about 50 µm, and therefore, the closest distance between two probes becomes at least 100 µm. Therefore, evaluation of electrical characteristics within a nano-scale area cannot be performed through use of the conventional cantilevers.

Further, in the conventional cantilevers, the pyramidal probes are formed not of a metal but of an insulating material or a semiconducting material, such as silicon, which exhibits anisotropy against etching. That is, in addition to the contact resistance between the probes and a sample, the resistances of the probes themselves affect measurement results. Therefore, the conventional cantilevers are not suitable for measurement of the electrical conductivity of the sample.

In order to avoid the above-described problem, when electrical characteristics are to be measured by use of a conventional cantilever (notably, when a single-probe measurement is performed), a metal is deposited on the entire lower surface of the cantilever, to thereby metallize the pyramidal probe.

However, the metal deposition causes formation of a short circuit between electrodes or between an electrode and a probe in a cantilever which must have electrodes for detection of deflection of the cantilever; i.e., a self-displacement-detection-type cantilever in which potential change of a piezoelectric element or resistance change of a resistor element formed on the cantilever is detected.

When a metal is deposited to thereby metallize the pyramidal probe, as a measure for avoiding formation of a short circuit, a cantilever of a displacement detection scheme (called an optical lever scheme), as shown in FIG. 1(b), has been used. In this scheme, a laser beam 26 is radiated onto the upper surface of a cantilever 25 by use of a semiconductor laser 24; and reflection light 27 is captured by use of a detector 28.

When the cantilever 25 deflects, the reflection angle θ of the laser beam 26 changes, and consequently the intensity of the reflection light 27 received by the detector 28 changes. The deflection of the cantilever 25 is detected through detection of the change in intensity of the reflection light 27. As shown in FIG. 1(b), this scheme enables formation of a metal deposition film 29 on the lower surface of the cantilever 25.

However, in this scheme, a semiconductor laser and a detector must be provided for each cantilever; and the positional relationship among each cantilever, a corresponding semiconductor laser, and a corresponding detector must be maintained constant at all times. Therefore, conventionally, the positional relationship among the cantilever, the semiconductor laser, and the detector is fixed; and the position of a sample is changed in order to change the relative position between the probe and the sample (single probe measurement).

However, positions of a plurality of cantilevers relative to a sample cannot be set freely by merely moving the sample. In other words, the conventional scheme cannot be applied to evaluation of electrical characteristics which requires a plurality of probes.

For the reasons described above, the cantilever as shown in FIG. 3 is used in the present invention, which is directed to measurement of electrical characteristics within a minute area by use of a plurality of probes.

FIG. 3(b) is a cross-sectional view taken along line A—A in FIG. 3(a). The resistance-measurement electrode 1 is connected to the resistor section 5 via the contact hole electrode 3. The resistor section 5 can be fabricated through a process of implanting boron, as an impurity, into an n-type silicon substrate 11 to thereby form a p-type region therein. Alternatively, the resistor section 5 may be fabricated through a process of implanting phosphorous or the like into a p-type substrate to thereby form an n-type region therein.

The method for forming the resistor section 5 is described in detail in Proceedings of Transducers '91 (IEEE, New York, 1991), pp. 448–451. An amount of deflection of the cantilever 6 is determined through detection of a change in the resistance caused by deflection of the cantilever 6; i.e., deflection of the resistor section 5. The resistor section 5 is electrically insulated, by means of an insulation film 9, from the electrodes connected to the probes. The cantilever 6 is supported by a support substrate 10 via an oxide film 12.

FIG. 3(c) is a cross-sectional view taken along line B—B in FIG. 3(a). The metal probe 8 is bonded to the tip of the electrical measurement electrode 7 by use of a conductive member 13. The metal probe 8 and the electrode 7 are insulated, by means of the insulation film 9, from the resistor section 5 and other sections.

FIG. 3(d) is a cross-sectional view taken along line C—C in FIG. 3(b) and FIG. 3(c). Both ends of the resistor section 5 are connected to the contact hole electrodes 3 and 4 respectively. As is apparent from FIG. 3(c), the cantilever 6 according to the present invention has the metal probe 8 provided at the tip of the cantilever 6; and the tip of the metal probe 8 projects beyond the free end of the cantilever. The metal probe 8 inclines relative to the surface of the free end portion of the cantilever, so that the metal probe 8 inclines relative to the sample surface as shown in FIG. 16.

Figure 5:
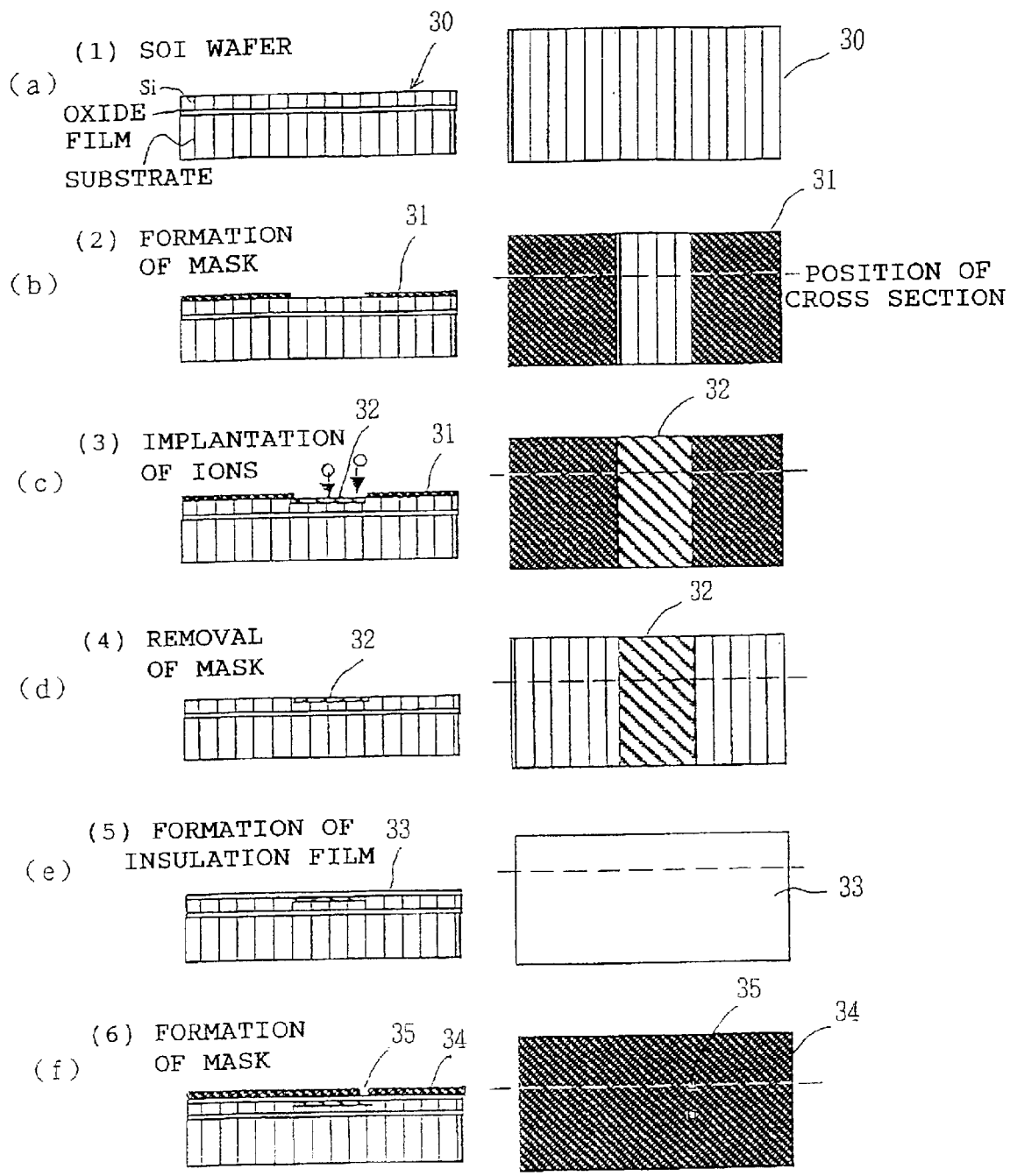
FIG. 5 is a set of views relating to the first embodiment of the present invention and showing a first group of steps of fabricating a cantilever substrate.
Figure 6:
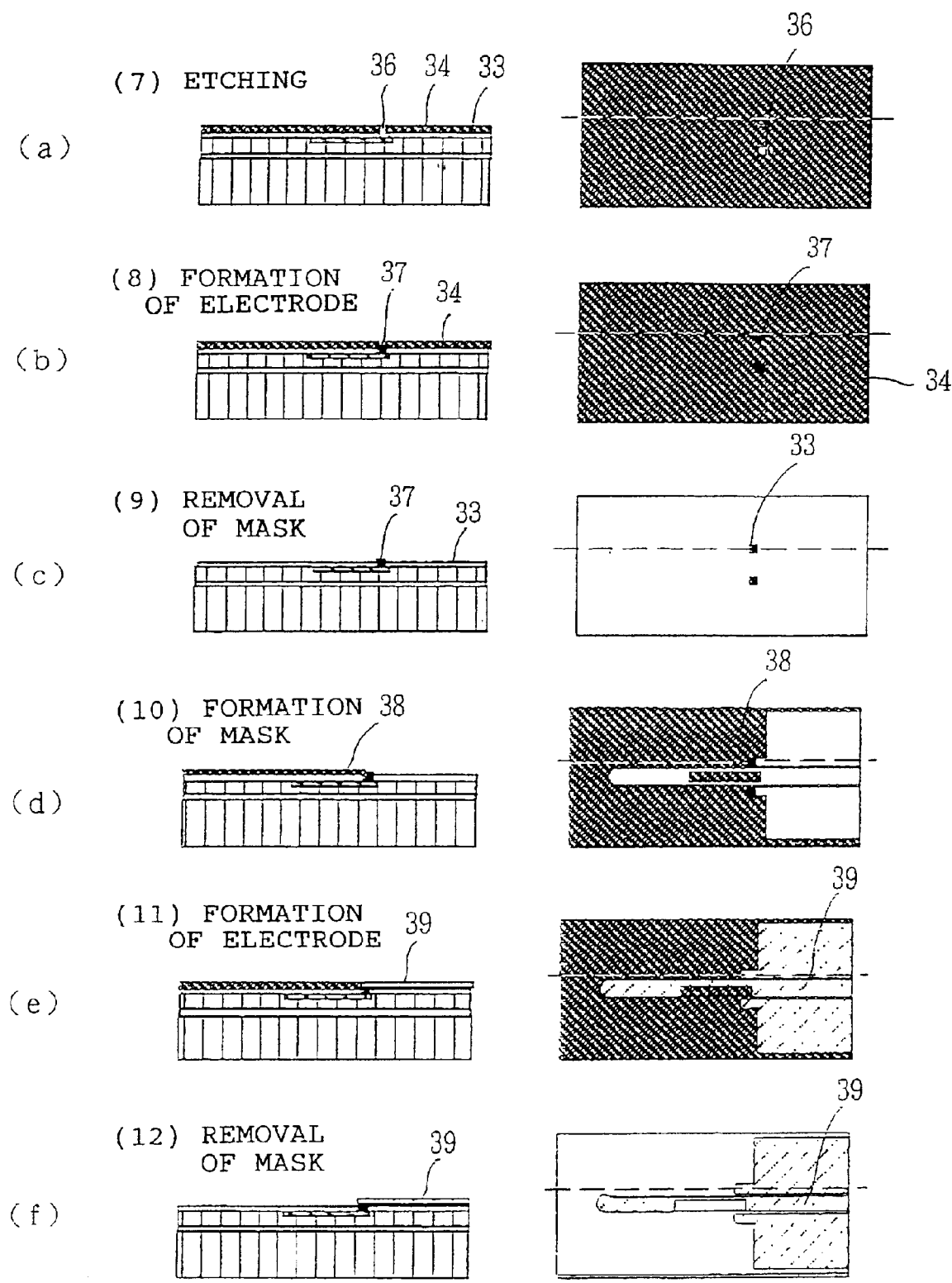
FIG. 6 is a set of views relating to the first embodiment of the present invention and showing a second group of steps of fabricating the cantilever substrate.
Figure 7:
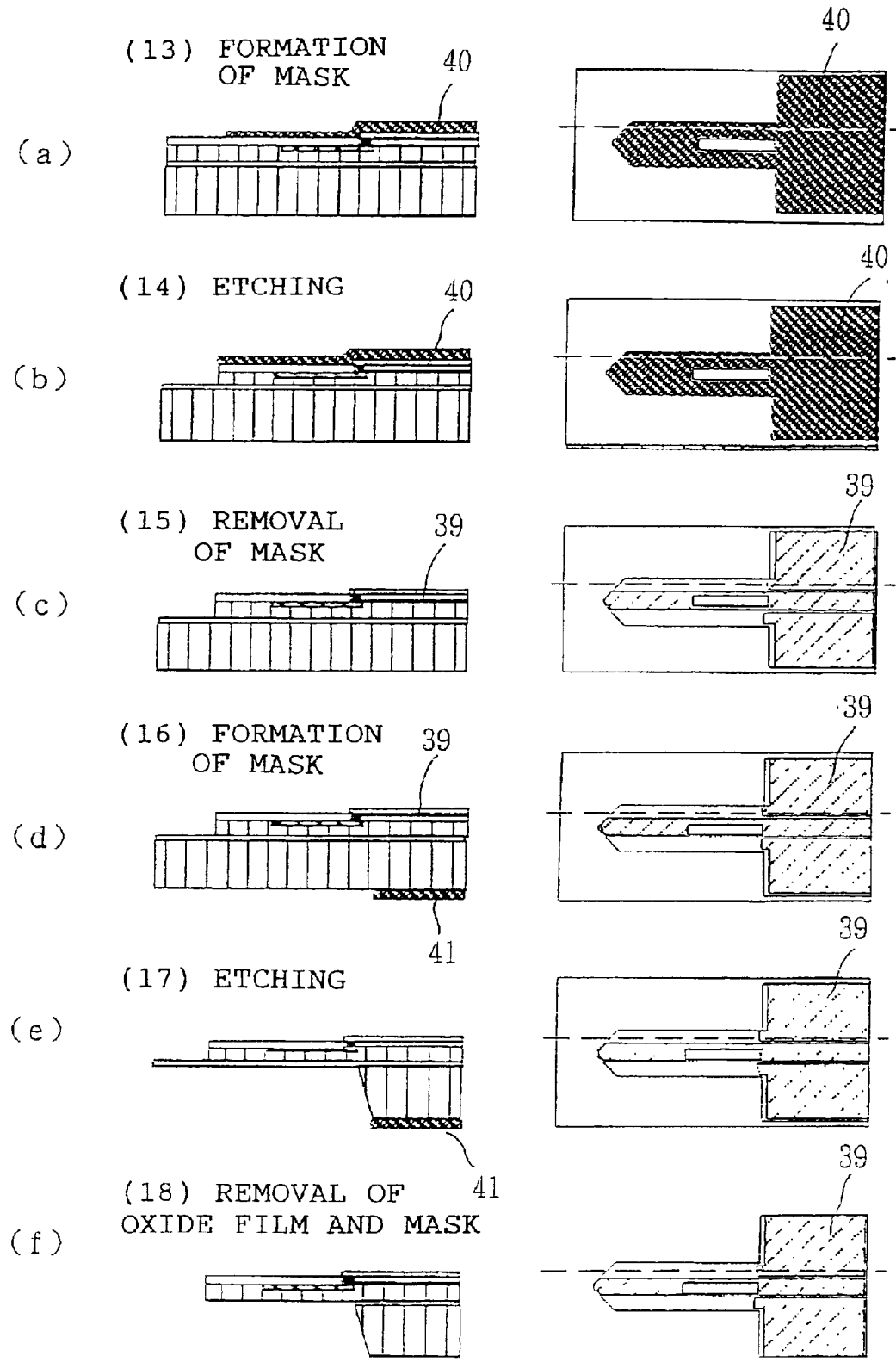
FIG. 7 is a set of views relating to the first embodiment of the present invention and showing a third group of steps of fabricating the cantilever substrate.

FIGS. 5 to 7 are views showing the steps of fabricating a cantilever substrate (a cantilever before attachment of a probe thereto) according to the first embodiment of the present invention. In these drawings, sectional views of the cantilever substrate are shown on the left side, and top views of the cantilever substrate are shown on the right side.

A (100)-face SOI (Silicon On Insulator) wafer 30 (in which an Si layer, an oxide film (1 µm), and a substrate are arranged, in this order, from the upper side) is used as a substrate (see FIG. 5(a)). First, a mask 31 is formed on the SOI wafer 30 in preparation for implantation of ions into the SOI wafer 30 (see FIG. 5(b)). Subsequently, ion implantation is performed to thereby form an ion diffused region 32 (see FIG. 5(c)). Subsequently, the mask 31 is removed (see FIG. 5(d)), and then an insulation film 33 is formed (see FIG. 5(e)). Subsequently, a mask 34 is formed in preparation for formation of a contact hole 35 (electrode) (see FIG. 5(f)).

Subsequently, a hole 36 is formed in the insulation film 33 through etching (see FIG. 6(a)). Subsequently, a contact hole electrode 37 is formed (see FIG. 6(b)), and then the mask 34 is removed (see FIG. 6(c)). Subsequently, a mask 38 for electrode formation is formed (see FIG. 6(d)), and then an electrode 39 is formed (see FIG. 6(e)). After that, the mask 38 is removed (see FIG. 6(f)).

Subsequently, a mask 40 for etching the Si layer other than a portion to serve as a cantilever is formed (see FIG. 7(a)), and then the insulation film 33 and the Si layer of the SOI wafer 30 are etched (see FIG. 7(b)). Subsequently, the mask 40 is removed to thereby form a cantilever on the oxide film layer of the SOI wafer 30 (see FIG. 7(c)). Subsequently, a mask 41 is formed on the upper surface (the lower surface in FIG. 7) of the cantilever (see FIG. 7(d)), and then the substrate of the SOI wafer 30 is etched (see FIG. 7(e)). Finally, the oxide film of the SOI wafer 30 and the mask 41 are removed to complete a cantilever substrate (see FIG. 7(f)).

In the present invention, a metal probe is transplanted to the thus-completed cantilever substrate. Specifically, a tip portion of a metal probe having undergone electrolytic polishing is cut-removed by use of a focused ion beam and transplanted to the free end of the cantilever substrate.

Figure 8:
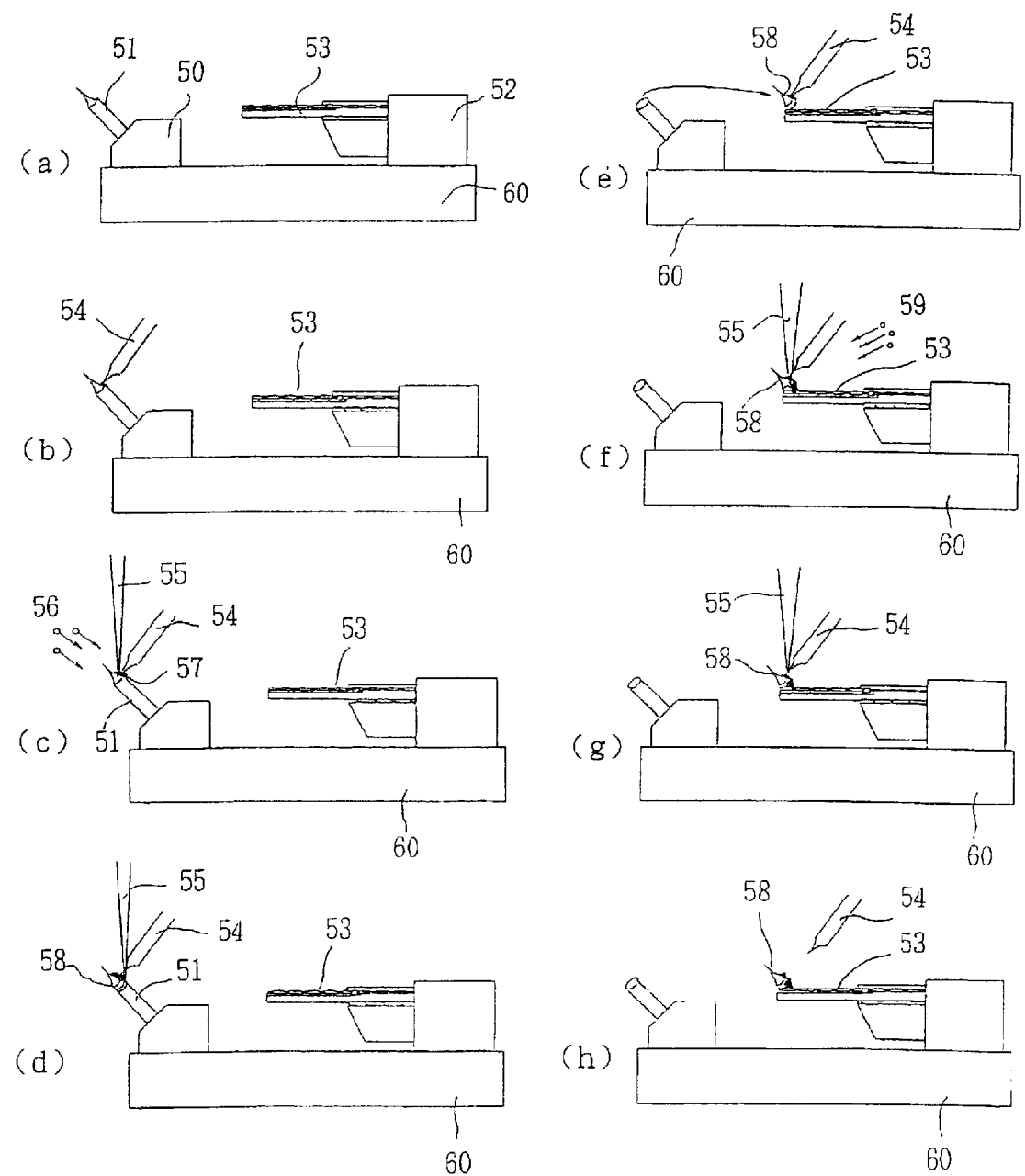
FIG. 8 is a set of views relating to the first embodiment of the present invention and showing an example procedure for transplanting a tip portion of a metal probe to the cantilever substrate.

FIG. 8 relates to the first embodiment of the present invention and shows an example procedure for transplanting a tip portion of a metal probe to the cantilever substrate.

(1) First, as shown in FIG. 8(a), a metal probe 51 whose tip end has been sharpened by means of electrolytic polishing is attached to a probe holder 50, which is disposed on a sample stage 60 of a focused ion beam apparatus; and a cantilever substrate 53, which has been formed by the above-described fabrication method, is attached to a cantilever holder 52. Although only the sample stage 60 of the focused ion beam apparatus is shown in FIG. 8(a), the metal probe 51 and the cantilever substrate 53 are placed, in the above-described condition, in a sample chamber of the focused ion beam apparatus.

(2) As shown in FIG. 8(b), a probe 54 having a sharpened tip and used for probe transfer is built in the focused ion beam apparatus. The probe 54 is brought into contact with the tip portion of the metal probe 51.

(3) Subsequently, as shown in FIG. 8(c), a focused ion beam 55 is radiated to a region in which the probe 54 is in contact with the metal probe 51, and simultaneously a reactive gas 56, such as hexacarbonyl tungsten [W(CO)$_6$], is introduced into the sample chamber. As a result, a bonding member 57 (e.g., tungsten) is grown in the contact region, and the probe 54 and the metal probe 51 are bonded together.

(4) Subsequently, as shown in FIG. 8(d), the metal probe 51 is cut by use of the focused ion beam 55. At this time, the cutting is performed at a location offset toward the root of the probe 51 from the position at which the probe 54 is bonded to the probe 51.

(5) Subsequently, as shown in FIG. 8(e), the metal-probe tip portion 58 cut-removed in the above-described manner is moved and transported onto the cantilever substrate 53.

(6) Subsequently, as shown in FIG. 8(f), while a reactive gas 59 is introduced, the focused ion beam 55 is radiated onto the root of the metal-probe tip portion 58 to thereby bond the metal-probe tip portion 58 onto the cantilever substrate 53. At this time, the species of the reactive gas 59 is chosen such that a conductive material is formed. For example, as described above, when hexacarbonyl tungsten is used, tungsten is grown. This enables simultaneous establishment of mechanical connection and electrical connection between the metal-probe tip portion 58 and the electrode on the cantilever substrate 53.

(8) Subsequently, as shown in FIG. 8(g), the probe 54 is separated from the metal-probe tip portion 58 by use of the focused ion beam 55.

(9) Finally, as shown in FIG. 8(h), the cantilever according to the present invention is completed.

As described above, the cantilever according to the first embodiment shown in FIG. 3 can be fabricated by the method shown in FIGS. 5 to 8.

Next, a second embodiment of the present invention will be described.

Here, description will be given of the entirety of an electrical-characteristic measurement apparatus on which the cantilever described in the first embodiment is mounted.

FIG. 9 is a system schematic diagram of the electrical-characteristic measurement apparatus according to the second embodiment of the present invention on which cantilevers are mounted.

A probe moving mechanism 100, which carries cantilevers according to the present invention, is disposed within an ultra-high vacuum system 101. The ultra-high vacuum system 101 consists of a vibration isolator 102, a vacuum pump 103, cantilever exchange mechanisms 104 and 105, a sample exchange mechanism 106, and a cantilever-sample introduction chamber 107.

The probe moving mechanism 100 is electrically controlled by a control system 108 disposed outside the vacuum system. Further, a scanning electron microscope (SEM) 109 is mounted on the system so as to confirm positions of the cantilevers and is controlled by an SEM control system 110.

Although the main portion (probe moving mechanism) 100 of the present invention can be operated in the atmosphere, in the present embodiment, an ultra-high vacuum system is employed in order to prevent contamination of a sample and enable use of the SEM. Accordingly, when an optical microscope is used as a means for microscopic observation of the cantilevers, the system may be placed in the atmosphere.

Figure 10:
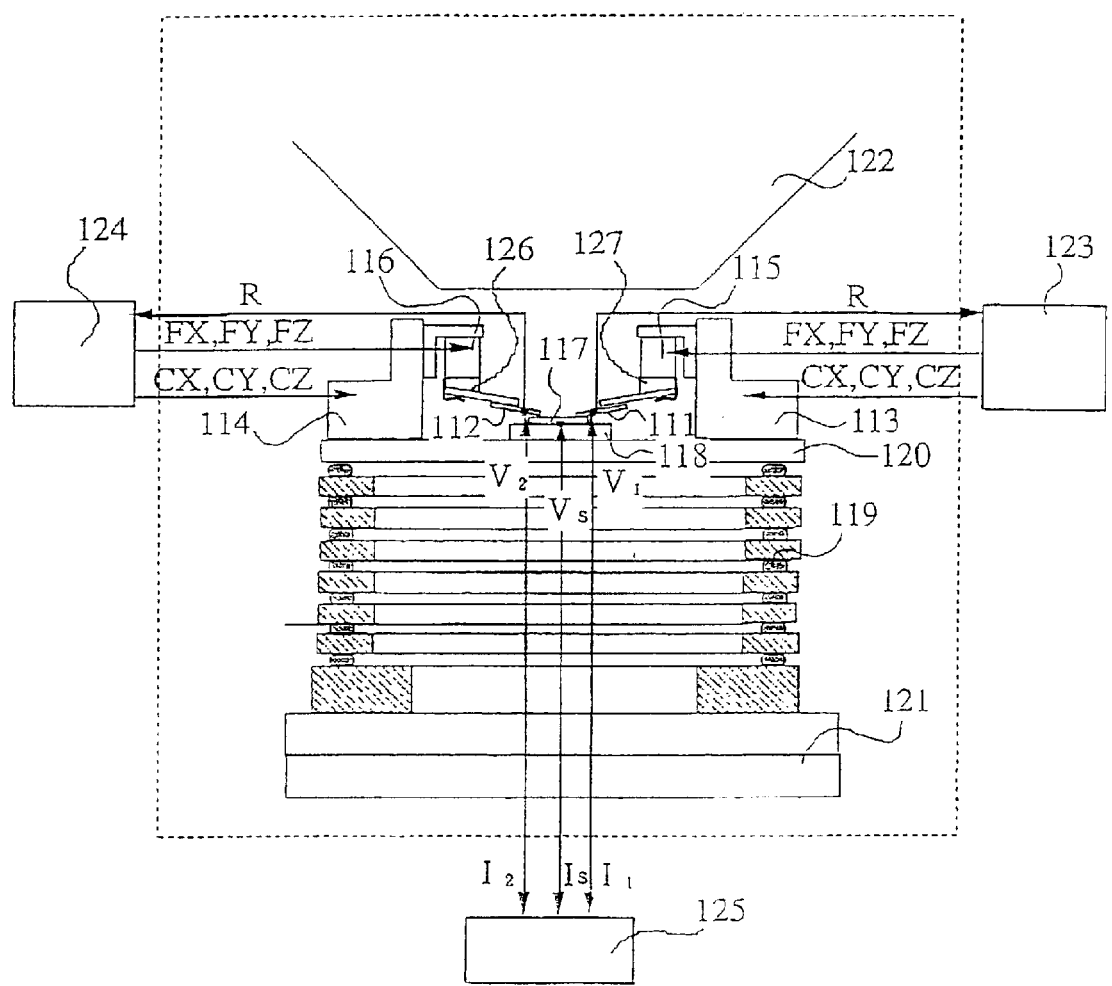
FIG. 10 is an enlarged schematic view of a probe moving mechanism, which is a main portion of the electrical-characteristic measurement apparatus.

FIG. 10 is an enlarged schematic view of the probe moving mechanism, which is a main portion of the electrical-characteristic measurement apparatus according to the present invention.

In the present embodiment, for the sake of simplicity, a system having two cantilevers will be described. The respective cantilevers (probes) 111 and 112 are disposed on respective moving mechanisms via cantilever holders 126 and 127, respectively. The moving mechanisms consist of coarse moving mechanisms 113 and 114 and fine moving mechanisms 115 and 116, respectively, which are capable of moving along three axes. This configuration enables the positions of the metal probes at the tips of the cantilevers 111 and 112 to be controlled with an accuracy of 0.1 nm or better.

In order to improve efficiency of experiments, the coarse moving mechanisms 113 and 114 desirably have a stroke of about several mm and an accuracy of about 1 µm, and the fine moving mechanisms 115 and 116 desirably have a stroke of about several µm and an accuracy of about 0.01 nm. In addition to these probe moving mechanisms, a sample 117 and a sample holder 118 are disposed on a stage 120, which is isolated from vibration by a rubber member 119. This structure enables the level of vibration of the stage 120 to be suppressed to an atomic level or less.

The above-described system is disposed on an X-Y stage 121, so that the probe and the sample can be moved together relative to an object lens 122 of the SEM. The moving distance of the X-Y stage 121 depends mainly on the size of a sample to be measured. However, the X-Y stage 121 desirably has a stroke of about 10 mm. During measurement, an operator moves the probes (cantilevers) 111 and 112 to desired locations on the surface of the sample 117 while performing SEM observation.

Such movement is effected by probe-position control systems 123 and 124, which supply drive signals CX, CY, and CZ to the coarse moving mechanisms 113 and 114 and drive signals FX, FY, and FZ to the fine moving mechanisms 115 and 116. Signals representing the resistances R of the resistor elements are fed from the cantilevers 111 and 112 to the probe-position control systems 123 and 124 to thereby enable monitoring of conditions of contact between the probes and the sample.

Specifically, while confirming the positions from an SEM image, the operator first moves the probes 111 and 112 along directions (X and Y directions) parallel to the sample 117. Subsequently, the operator moves the probes 111 and 112 toward the sample 117 (along the Z direction) to a point at which an atomic force acts between the probe and the sample. Since the resolution of the SEM is 10 nm at the highest, the following procedure is performed in order to set the probes at desired positions on the X-Y plane with atomic-level accuracy. By use of atomic force microscopy, the respective probes are caused to scan over the sample surface; the positions of the probes are determined from the obtained images; and the probes 111 and 112 are then positioned by means of the fine moving mechanisms 115 and 116. After determination of the probe positions, an electrical-characteristic measurement system 125 applies bias voltages $V_1$, $V_2$, and $V_s$ to the probe 111, the probe 112, and the sample 117, respectively, and measures currents $I_1$, $I_2$, and $I_s$.

This enables measurement of electrical characteristics within a minute area. A portion in FIG. 10 surrounded by a dotted line is placed in the high-vacuum system 101 shown in FIG. 9, which is a schematic view of the apparatus; and the probe-position control systems 123 and 124 and the electrical-characteristic measurement system 125 are disposed within the control system 108.

Next, a third embodiment of the present invention will be described.

Here, a measurement method using the cantilevers according to the present invention will be described.

Figure 2:
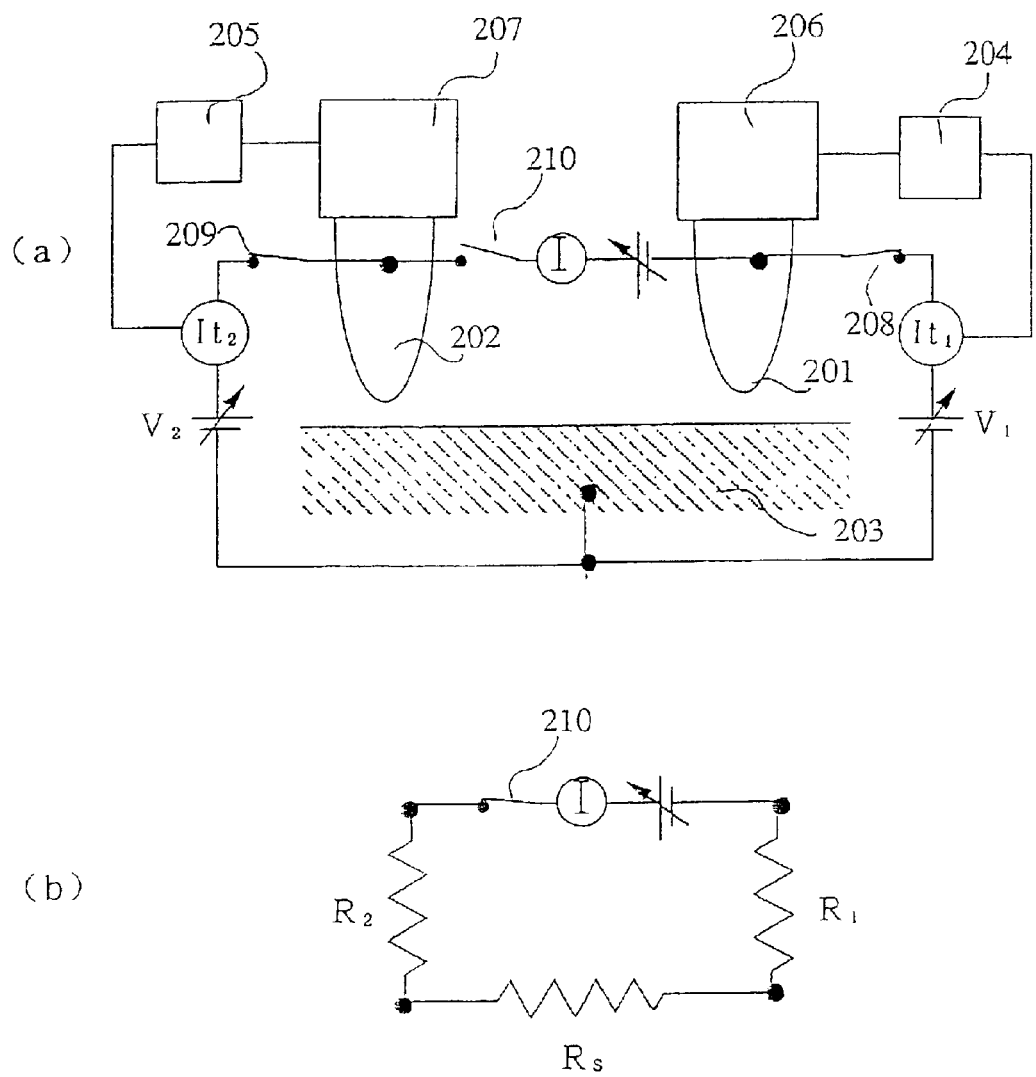
FIG. 2 is a set of diagrams showing a conventional measurement method using cantilevers.

In a conventional method which utilizes scanning tunneling microscopy, as shown in FIG. 2(a), tunneling current control systems 204 and 205 and probe moving mechanisms 206 and 207 first control the positions of probes 201 and 202 in such a manner that a preset tunneling current $It_1$ flows between the probe 201 and a sample 203, and a preset tunneling current $It_2$ flows between the probe 202 and the sample 203. During this operation, switches 208 and 209 are closed, and a switch 210 is opened.

Subsequently, when electrical characteristics of the sample are to be measured, the switches 208 and 209 are opened, and the switch 210 is closed. In other words, a closed loop shown in FIG. 2(b) is formed. In FIG. 2(b), $R_1$ and $R_2$ represent the contact resistances between the probes and the sample, which are determined from the tunneling currents $It_1$ and $It_2$ and tunneling voltages $V_1$ and $V_2$.

For example, when the position of a probe is held in a state in which a tunneling current of 1 nA flows upon application of a bias voltage of 1 V, the contact resistance becomes 1 GΩ. The contact resistance remains at about 1 MΩ even when the voltage is reduced (to 10 mV) and the current is increased (to 10 nA). Therefore, realization of a contact resistance smaller than that resistance has been difficult insofar as the probe positions are controlled by tunneling microscopy.

By contrast, the resistance of a sample to be measured is about several kΩ even in a system in which a quantized conductance appears. Therefore, contact resistances at least 100 times a resistance to be measured have been contained in the conventional measurement system. Further, since the positions of the probes are not controlled on the basis of tunneling current during measurement, it has not been guaranteed that the probe positions are maintained constant.

FIG. 11 schematically shows the relationship between distance between the probe and the sample and contact resistance between the probe and the sample. In the conventional method (STM), since the probe positions are maintained within a region (tunneling region) in which tunneling current flows, contact resistances become about 1 MΩ to 1 GΩ and cannot be reduced.

By contrast, in the case of employment of atomic force microscopy (AFM) in which the microscope is operated while force acting between a probe and a sample is detected, the distance between the probe and the sample can be set freely (over the entire region shown in FIG. 11), so that a low contact resistance of several Ω can be realized. For this reason, probe position control on the basis of the atomic force microscopy is employed in the present invention.

FIG. 12 is a graph showing the relationship between distance between the probe and the sample and force acting between the probe and the sample. In order to realize the low contact resistance shown in FIG. 11, the distance between the probe and the sample must be maintained at about 0.1 nm. Accordingly, it is understood that the distance between the probe and the sample must be controlled to within a region in which the force acting between the probe and the sample becomes a repulsive force. The magnitude of the repulsive force is determined in accordance with the materials of the probe and the sample and the size of the contact area. However, in general, the magnitude of the repulsive force is about 1 nN to 1 μN.

Example measurement of a nano-transistor performed by use of the apparatus of the present invention will be described with reference to FIG. 13.

FIG. 13(a) shows an example in which characteristics of a nano-transistor including atomic wires 211, 212, and 213 and an island structure 214 are measured. Metal probes 218, 219, and 220 disposed at the free ends of cantilevers 215, 216, and 217 are in contact with the atomic wires 211, 212, and 213 (a source 211, a drain 213, and a gate 212), respectively.

As described above, use of the cantilevers according to the present invention enables the metal probes 218, 219, and 220 to come into low-resistance contact with the structural elements (the source 211, the drain 213, and the gate 212) of the nano-transistor formed within a 10-nm area. FIG. 13(b) shows results of a measurement operation in which the gate-voltage dependency of the source-drain current was measured in the above-described state.

As shown in FIG. 13(b), measurement results show that the current-voltage characteristic curve shifts depending on the number n (in the drawing, represented by N=n) of electrons trapped in the island structure 214. The dotted lines in the drawing represent current-voltage characteristics for the case in which the number of electrons trapped in the island structure 214 is constant.

Conventionally, before performance of characteristic measurement, atomic wires must be connected to a macro measurement system by means of, for example, wiring connection. The present invention enables such measurement to be performed more easily and with greater accuracy.

Next, a fourth embodiment of the present invention will be described.

Figure 14:
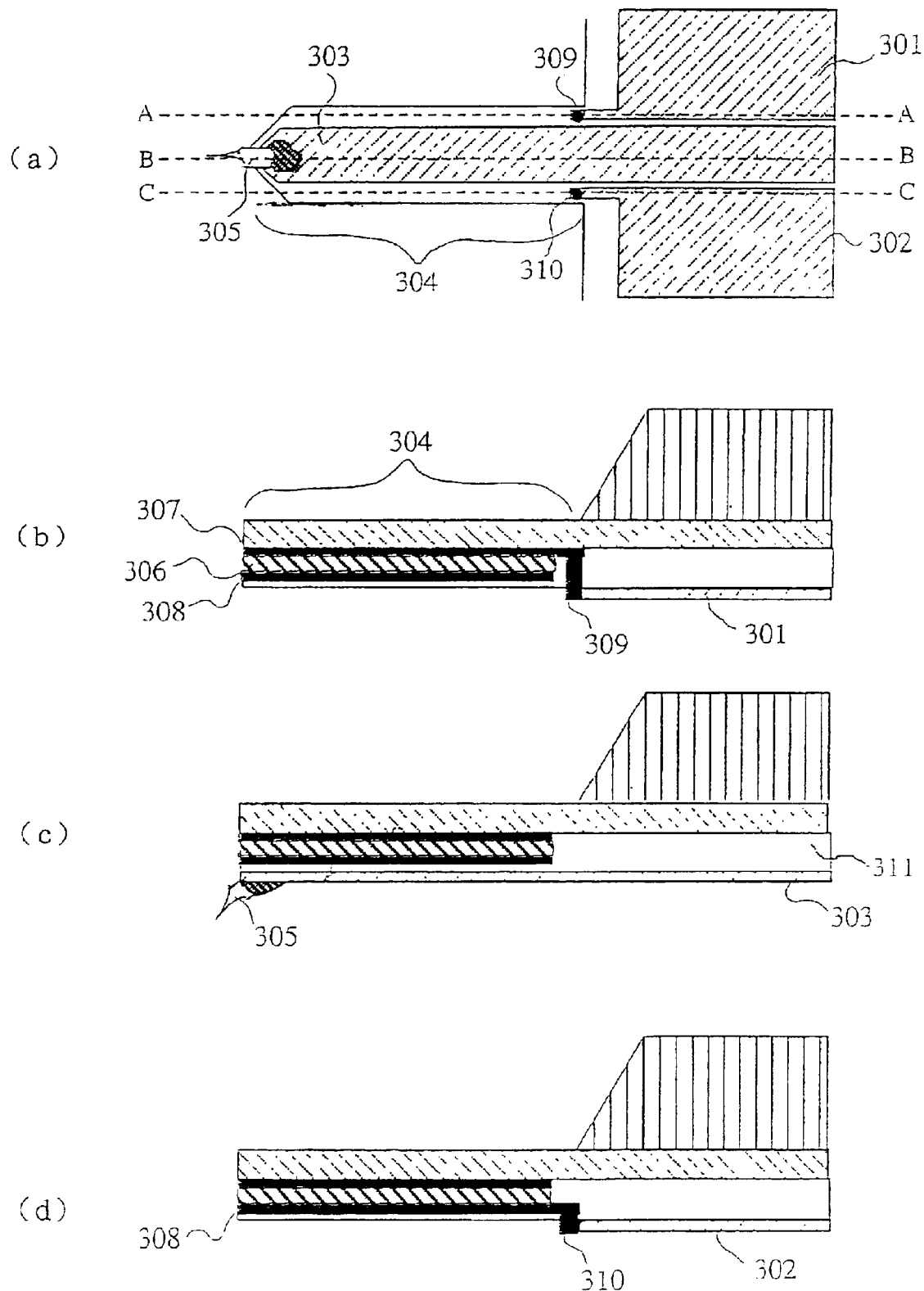
FIG. 14 is a set of schematic views showing a cantilever according to a fourth embodiment of the present invention.

FIG. 14 is a set of schematic views showing a cantilever according to a fourth embodiment of the present invention.

FIG. 14(a) is a schematic view of a bottom surface (a surface that faces a sample) of the cantilever. As in the case of the cantilever described in the first embodiment, three electrodes 301, 302, and 303 are formed on the cantilever 304. A metal probe 305 is disposed at the free end of the cantilever 304. The tip of the metal probe 305 projects beyond the free end of the cantilever 304. Reference numerals 309 and 310 denote contact hole electrodes.

FIG. 14(b) is a cross-sectional view taken along line A—A in FIG. 14(a). A piezoelectric element 306 and electrodes 307 and 308 are formed on the cantilever 304 in such a manner that the electrodes 307 and 308 sandwich the piezoelectric element 306. Voltage induced upon deflection of the cantilever 304; i.e., deflection of the piezoelectric element 306, is detected by use of the electrodes 307 and 308.

The electrode 307 is connected to the electrode 301 via the contact hole 309; and the electrode 308 is connected to the electrode 302 via the contact hole 310 [see FIG. 14(d), cross section taken along C—C in FIG. 14(a)]. An electrode 303 for electrical characteristic measurement is electrically isolated from these electrodes by means of an insulation film 311 [see FIG. 14(c), cross section taken along B—B in FIG. 14(a)].

The deflection detection scheme using the piezoelectric effect itself has been conventionally known [see, e.g., Rev. Sci. Instrum. 67 (1996), pp. 3896–3903]. However, the features of the present invention reside in that the tip of a metal probe disposed at the free end of each cantilever projects beyond the free end of each cantilever, and that, in addition to electrodes for detecting the piezoelectric effect, an electrode for measuring electrical characteristics is formed on the cantilever.

As having been described in connection with the first through third embodiments, these features enable evaluation of electrical characteristics within a minute area.

Next, a fifth embodiment of the present invention will be described.

Here, a different method of disposing a metal probe at the tip of a cantilever will be described. In the first embodiment, a method in which a metal probe is cut and bonded by use of a focused ion beam has been described. In the present embodiment, a metal probe is formed at the free end of a cantilever by use of the principle of selective growth of a metal. In the present invention, since the configuration such that the tip of a metal probe projects beyond the free end of a corresponding cantilever is important, the direction of selective growth of the metal probe must be controlled.

Figure 15:
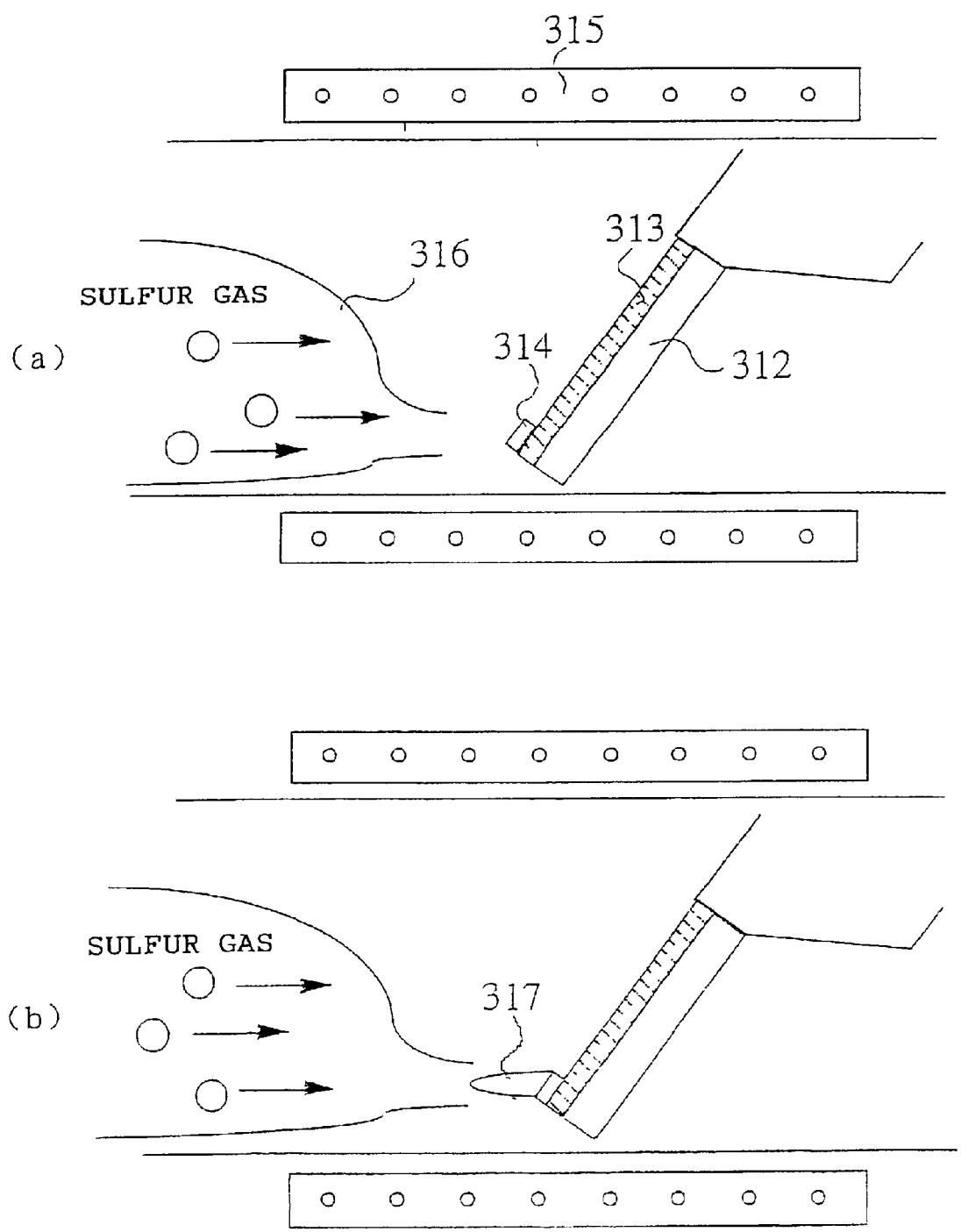
FIG. 15 is a set of views showing steps of fabricating a cantilever according to a fifth embodiment of the present invention.

FIG. 15 includes views showing steps for fabricating a cantilever according to the fifth embodiment of the present invention.

First, a silver particle 314, which serves as a seed for selective growth, is deposited on a metal electrode 313 formed on a cantilever 312. Through vapor deposition using a mask, a particle having a particle diameter of about 0.1 μm can be deposited. The cantilever 312 is placed in a flow of sulfur gas in an orientation shown in FIG. 15(a), and the temperature is maintained at about 300° C. by use of a heater 315. By use of a capillary tube 316, sulfur gas is jetted in a single direction to the silver particle 314 in order to grow a crystal of silver sulfide ($Ag_2S$) 317 in the direction of the sulfur gas flow as shown in FIG. 15(b), while using the silver particle 314 as a seed crystal. Thus, a metal probe formed of silver sulfide can be fabricated.

Alternatively, a probe can be provided at the tip of a cantilever through a process of heating and reducing a metal halide in a stream of water vapor to thereby grow a metal whisker. In the present invention, since the configuration such that the tip of the metal probe projects beyond the free end of the cantilever is important, the position and orientation of the seed crystal must be controlled. In an example case in which copper chloride (CuCl) is used as a halide, since growth occurs in the [100] direction, the seed crystal must be disposed in such a manner that its [100] direction coincides with the direction in which a metal probe is to be grown. By contrast, in the above-described method making use of a crystal of silver sulfide, since the direction of growth can be controlled through adjustment of the direction of the sulfur gas flow, controlling the direction of selective growth can be performed with ease.

The present invention is not limited to the above-described embodiments. Numerous modifications and variations of the present invention are possible in light of the spirit of the present invention, and they are not excluded from the scope of the present invention.

As having been described in detail, the present invention enables a plurality of probes to come into contact with a minute area with low contact resistance. Therefore, electrical characteristics of a nano-scale structure can be measured with high accuracy without use of wiring connection or other connection means.

INDUSTRIAL APPLICABILITY

As described above, the electrical-characteristic evaluation apparatus according to the present invention realizes, in particular, low-resistance contact (nano contact) of a plurality of probes with a nano-scale area, and can directly evaluate electrical characteristics of a nano-scale structure with high accuracy. Therefore, the electrical-characteristic evaluation apparatus according to the present invention is suitable for measurement of electrical characteristics of a nano-scale structure which is formed on an insulating substrate and has an arbitrary shape.

What is claimed is:

1. An electrical-characteristic evaluation apparatus comprising:
   a plurality of cantilevers configured to be individually driven to deflect a free end portion to individually control a positional relationship between a metal probe provided at the free end portion of each cantilever and a sample by means of atomic force microscopy, wherein
   each metal probe has a tip that projects from the free end portion of the cantilever, each metal probe is inclined from a perpendicular condition relative to a surface of the free end portion of each cantilever to thereby have an inclination relative to a surface of the sample, and each metal probe is bonded by use of a conductive material onto an electrode provided at the free end of each corresponding cantilever.

2. An electrical-characteristic evaluation apparatus according to claim 1, wherein a resistor element is formed on each cantilever, and deflection of each cantilever is detected based on a change in a resistance of the resistor element.

3. An electrical-characteristic evaluation apparatus according to claim 2, wherein at least three electrodes are provided on each cantilever or on a cantilever support substrate, with at least two of the at least three electrodes being connected to the resistor element and at least one electrode of the at least three electrodes being connected to the metal probe.

4. An electrical-characteristic evaluation apparatus according to claim 1, wherein a piezoelectric element is formed on each cantilever, and deflection of the cantilever is detected on basis of change in electrical potential of the piezoelectric element.

5. An electrical-characteristic evaluation apparatus according to claim 1, wherein the positional relationship between probes of the plurality of cantilevers and the sample is controlled in such a manner that a repulsive atomic force is produced between the probes and the sample.

6. An electrical-characteristic evaluation apparatus according to claim 1, wherein a metal probe of a corresponding cantilever is formed, by means of selective growth, on an electrode provided at the free end of the corresponding cantilever.

7. An electrical-characteristic evaluation apparatus according to claim 4, wherein at least three electrodes are provided on each cantilever or on a cantilever support substrate, with at least two of the at least three electrodes being connected to the piezoelectric element and at least one electrode of the at least three electrodes being connected to the metal probe.

* * * * *